United States Patent
Isakanian

(10) Patent No.: US 9,762,237 B1
(45) Date of Patent: Sep. 12, 2017

(54) CONSTANT IMPEDANCE TRANSMITTER WITH VARIABLE OUTPUT VOLTAGE LIMITS

(71) Applicant: QUALCOMM Incorporated, San Diego, CA (US)

(72) Inventor: Patrick Isakanian, El Dorado Hills, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/192,921

(22) Filed: Jun. 24, 2016

(51) Int. Cl.
| | |
|---|---|
| H03B 1/00 | (2006.01) |
| H03K 19/00 | (2006.01) |
| H03K 17/687 | (2006.01) |
| G11C 11/4074 | (2006.01) |
| G11C 11/408 | (2006.01) |

(52) U.S. Cl.
CPC ...... *H03K 19/0005* (2013.01); *G11C 11/4074* (2013.01); *G11C 11/4085* (2013.01); *G11C 11/4087* (2013.01); *H03K 17/687* (2013.01)

(58) Field of Classification Search
None
See application file for complete search history.

(56) References Cited

U.S. PATENT DOCUMENTS

| | | | |
|---|---|---|---|
| 7,365,569 B1 * | 4/2008 | Venugopal | H03K 3/35613 326/68 |
| 8,446,173 B1 | 5/2013 | Faucher et al. | |
| 8,520,348 B2 | 8/2013 | Dong | |
| 8,922,240 B2 * | 12/2014 | Song | H03K 19/01855 326/30 |
| 9,231,631 B1 | 1/2016 | Ke et al. | |
| 2006/0119430 A1 * | 6/2006 | Poulton | H03F 3/45188 330/253 |
| 2009/0323234 A1 * | 12/2009 | Bach | H01L 27/0251 361/56 |
| 2013/0278296 A1 | 10/2013 | Amirkhany et al. | |
| 2015/0188612 A1 * | 7/2015 | Cho | H04B 5/02 455/41.1 |
| 2016/0072645 A1 | 3/2016 | Chen et al. | |
| 2016/0099706 A1 * | 4/2016 | Lee | G05F 3/24 327/109 |

* cited by examiner

*Primary Examiner* — Cassandra Cox
(74) *Attorney, Agent, or Firm* — Haynes and Boone, LLP

(57) ABSTRACT

A transmitter is provided with a plurality of pull-up legs and a plurality of pull-down legs. A controller controls the pull-up legs and the pull-down legs so that a constant output impedance is provided while supporting a range of logic-high output voltages.

18 Claims, 4 Drawing Sheets

CONSTANT IMPEDANCE TRANSMITTER WITH VARIABLE OUTPUT VOLTAGE LIMITS

TECHNICAL FIELD

This application relates generally to a transmitter, and more particularly to a constant impedance transmitter with variable output voltage limits.

BACKGROUND

Mobile devices typically include a system-on-a-chip (SOC) that is packaged with one or more dynamic random access memories (DRAMs). To save power, various low power double data rate (LPDDR) protocols have been developed for the signaling between the SOC and the corresponding DRAMs. Depending upon the LPDDR mode of operation, the logic-high output voltage (Voh) used to transmit a binary one bit between the SOC and the DRAM is varied. This variation in the logic-high output voltage is independent of the power supply voltage (VDD) for the SOC. The resulting independence between the SOC power supply voltage and the logic-high output voltage for the data transmitted to each DRAM from the SOC causes issues for the SOC transmitter. In particular, the SOC transmitter typically is formed using an inverter that has a PMOS transistor in series with an NMOS transistor. As the output voltage varies depending upon the DRAM mode of operation, the NMOS transistor may transition from saturation to a triode mode of operation that makes impedance matching the SOC transmitter to the transmission line that propagates the data to each DRAM problematic.

Accordingly, there is a need in the art for transmitters having constant impedance while supporting variable logic-high output voltages.

SUMMARY

A transmitter is provided with a plurality of pull-up legs and a plurality of pull-down legs. Each pull-up leg and pull-down leg has a thick-oxide transistor that functions as a resistor when switched on by a controller. Each pull-up leg also has a thin-oxide data transistor that switches on in response to a first binary state of an input data signal. Similarly, each pull-down leg has a thin-oxide data transistor that is configurable to switch on in response to a second binary state of the input data signal. The pull-up legs are arranged in parallel between a power supply node supplying a low power supply voltage and an output terminal. Similarly, the pull-down legs are arranged in parallel between the output terminal and ground.

The controller is configured to control the data transistor in selected ones of the pull-down legs to remain continuously on regardless of the binary state of the input data signal. By adjusting the number of continuously switched on data transistors in pull-down legs having switched-on thick-oxide transistors as a function of the number of pull-down legs having switched-off thick-oxide transistors, the controller may alter its logic-high output voltage while maintaining a constant output impedance for the transmitter.

These and additional advantages may be better appreciated through the following detailed description.

BRIEF DESCRIPTION OF THE DRAWINGS

Various aspects of the present disclosure and their advantages are best understood by referring to the detailed description that follows. It should be appreciated that like reference numerals are used to identify like elements illustrated in one or more of the figures.

DETAILED DESCRIPTION

Figure 1:
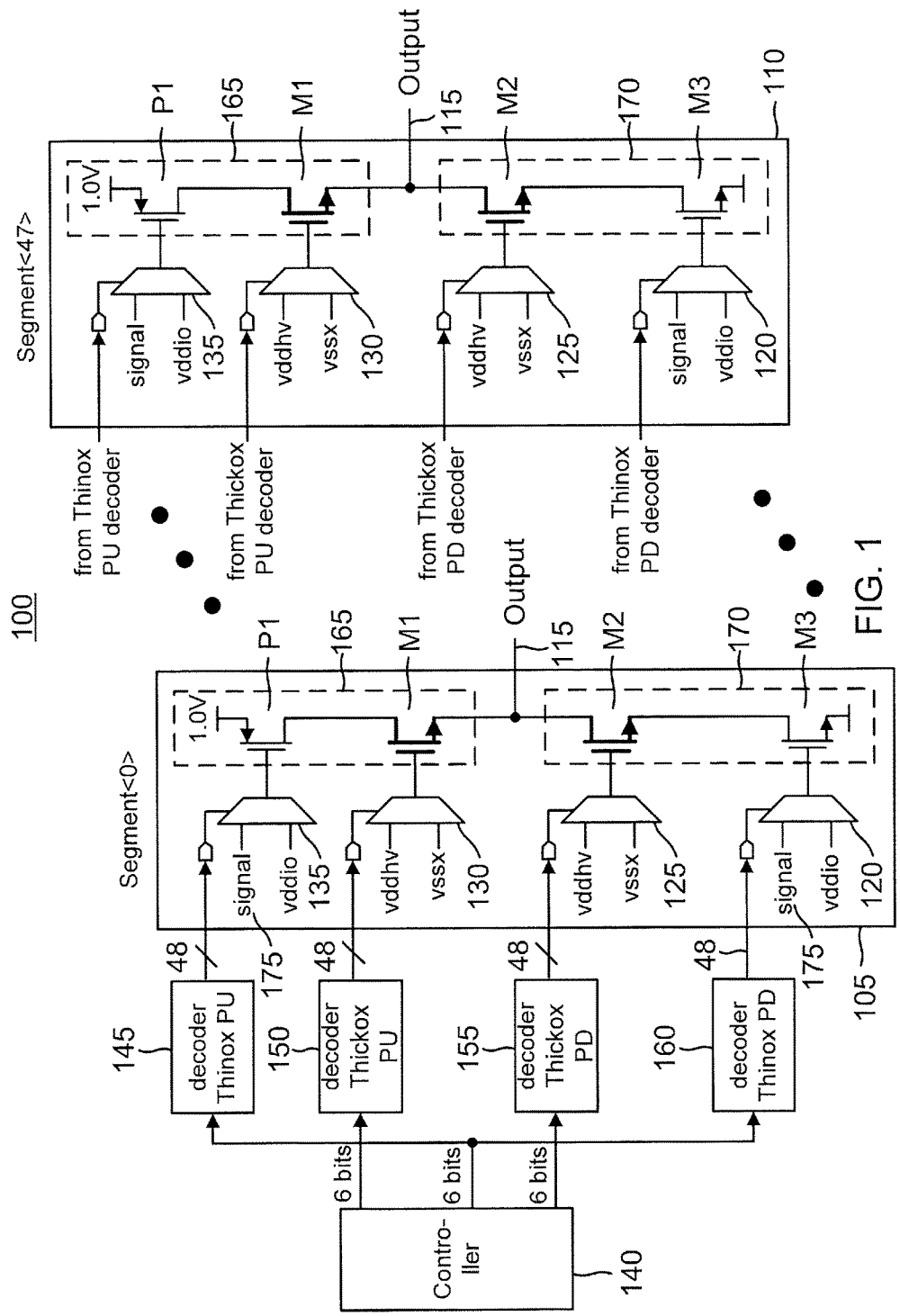
FIG. 1 is a circuit diagram of an example transmitter in accordance with an aspect of the disclosure.

To provide a constant output impedance while supporting a variety of logic-high output voltages, a transmitter is provided with a plurality of selectable segments arranged in parallel with regard to a common output terminal. Each segment includes an independently-enabled thick-oxide pull-up transistor that functions as a pull-up resistor. If a segment's pull-up resistor is enabled (the thick-oxide pull-up transistor being switched on), it provides a resistive conductive path between the output terminal and a pull-up data transistor for the segment. Each segment's pull-up data transistor is coupled between a power supply node supplying a low power supply voltage and the segment's pull-up resistor. Depending upon the binary state of the input data signal for a segment with a switched-on (enabled) pull-up resistor, the segment's pull-up data transistor switches on to charge the output terminal through the corresponding enabled pull-up resistor.

The enabled segments that charge the output terminal all do so in parallel. The resulting output impedance for the transmitter during a pull-up of the output terminal thus equals the pull-up resistor's resistance divided by the number of enabled segments for the pull-up. Each pull-up resistor's resistance may be assumed to be equal and will vary depending upon the process corner. If this resistance is assumed to equal approximately 1.5KΩ, then enabling 30 segments for pull-up of the output terminal provides an output impedance of 50Ω. It will be appreciated that the number of segments necessary to meet a typical output impedance such as 50Ω will depend upon the dimensions of each thick-oxide pull-up transistor and corresponding pull-up data transistor as well as the particular process, voltage, and temperature (PVT) corner. To provide an output impedance that may be varied across some expected impedance range of possible transmission lines such as a range of 37Ω to 60Ω, a sufficient number of segments is desirable. The following discussion is directed to a transmitter with forty-eight segments but it will be appreciated that the total number of segments depends upon a number of factors such as the desired output impedance tuning range and also the impedance of the pull-up and pull-down paths in each segment.

The control of the output impedance for a pull-down (discharge to ground) of the output terminal is analogous to the pull-up control in that each segment includes an independently-enabled thick-oxide pull-down transistor that functions as a pull-down resistor. If a segment's pull-down resistor is enabled, it provides a resistive conductive path between the output terminal and a pull-down data transistor for the segment. Each segment's pull-down data transistor is coupled between ground and the pull-down resistor. Depending upon the binary state of the input data signal, the pull-down data transistor switches on to discharge the output terminal through the corresponding enabled pull-down resistor.

The enabled segments that discharge the output terminal all do so in parallel. The resulting output impedance for the transmitter during a pull-down of the output terminal thus equals the pull-down resistor's resistance divided by the number of enabled segments for the pull-up. If this resistance is assumed to equal approximately 1.5KΩ, then enabling 30 segments for pull-down of the output terminal provides an output impedance of 50Ω. The serial combination of the pull-up data transistor and the thick-oxide pull-up transistor for a segment is denoted herein as a pull-up leg. Similarly, the serial combination of the pull-down data transistor and the thick-oxide pull-down transistor for a segment is denoted herein as a pull-down leg.

Without further control of the pull-up and pull-down data transistors, the logic-high output voltage for the transmitter will be one-half of the transmitter power supply voltage, assuming that the output impedance is matched to the impedance of a transmission line coupling the output terminal for the transmitter to each DRAM. Should the transmitter power supply voltage be relatively high but the desired value of the logic-high output voltage for a given DRAM mode of operation be relatively low, the division of the transmitter power supply voltage by the voltage divider formed by the transmission line impedance and the transmitter pull-up impedance may result in a logic-high output voltage that is higher than the desired level. To decrease the output voltage while maintaining a constant output impedance, the pull-down data transistors in some of the segments that are enabled for pull-down may be maintained continuously on despite the binary value of the input data signal. To maintain a constant output impedance during pull-up of the output terminal, a corresponding number of pull-up thick-oxide transistors are switched off.

For example, suppose that a 50Ω line impedance is matched with thirty pull-up legs and thirty pull-down legs enabled. To move the output voltage lower than mid-rail (one-half of the transmitter power supply voltage) a certain number of pull-down legs are left continuously on. Assuming that the pull-up and pull-down resistances are the same, the same number of pull-up legs in the set of formerly-enabled pull-up legs may be switched continuously off. For example, suppose that switching off twelve of the pull-up legs causes the collective impedance of the remaining enabled pull-up legs to increase to 100Ω. The collective impedance for the continuously switched on pull-down legs should also equal 100Ω. Such an equality is assured if the same number of previously-enabled pull-up legs being permanently switched off equals the same number of enabled pull-down legs being continuously switched on for embodiments in which the impedance of each pull-up leg equals the impedance of each pull-down leg.

If the pull-down leg impedance differs from the pull-up leg impedance, the number of pull-down legs being continuously switched on as a function of the number of the formerly-enabled pull-up legs being switched off may be adjusted according to the ratio of the pull-up leg impedance to the pull-down leg impedance. The following discussion will assume that the pull-down leg impedance equals the pull-up leg impedance without loss of generality. Consider again the example embodiment in which the matching impedance is 50Ω and a mid-rail logic-high output voltage requires thirty pull-up legs to be enabled during pull-up. The same number thirty of pull-down legs would thus be enabled on pull-down. If the logic-high output voltage is then to be lowered to a quarter of the transmitter power supply voltage, fifteen of the formerly-enabled pull-up legs are instead disabled while fifteen of the enabled pull-down legs are continuously switched on. With regard to pull-up, the fifteen continuously switched on pull-down legs are in parallel with the 50Ω line impedance such that the resulting parallel combination of the line impedance and the continuously switched on pull-down leg impedance presents a 33.33Ω resistance to the remaining fifteen enabled pull-up legs. The parallel combination of the fifteen enabled pull-up legs presents a 100Ω impedance. The resulting voltage divider for the logic-high output voltage becomes 33.33/133.33=0.25 such that the desired one-quarter rail logic-high output voltage is achieved. But note that the output impedance remains matched since during pull-up the 100Ω impedance of the enabled pull-up legs is in parallel with respect to the 100Ω impedance of the continuously switched on pull-down legs. This advantageous maintenance of a constant output impedance while supporting variable logic-high output voltages may be better appreciated through the following example embodiments.

Turning now to the drawings, an example transmitter 100 is shown in FIG. 1. For illustration clarity, only an initial zeroth segment 105 and a final forty-seventh segment 110 are shown in FIG. 1 from a total of forty-eight segments. Each segment includes a pull-up leg 165 and a pull-down leg 170. These legs operate independently from each other such that the number of enabled pull-up legs 165 is not tied to the number of enabled pull-down legs 170. Each pull-up leg 165 includes a thick-oxide NMOS pull-up transistor M1 having a source coupled to a common output node 115. In addition, each pull-up leg 165 includes a thin-oxide PMOS transistor P1 having a source tied to a power supply node supplying a low power supply voltage (the transmitter power supply voltage) such as 1.0 V. Such a voltage level is representative and will vary depending upon the mode of operation for transmitter 100. Moreover, the number of segments is representative and will vary depending upon the desired output impedance range for a given transmitter design. For each pull-up leg 165, a corresponding multiplexer 130 selects between a high power supply voltage (vddhv) and ground (vssx) to drive the gate of its thick-oxide pull-up transistor M1 with the selected signal. The high power supply voltage is always greater than the low power supply voltage in all the operating modes. As implied by the name, the thin-oxide transistors disclosed herein have a thinner gate oxide layer than the disclosed thick-oxide transistors. The thick-oxide transistors can thus withstand a stronger gate voltage such as the high power supply voltage. In contrast, the thin-oxide transistors are not robust to such elevated voltage levels.

Each pull-up leg 165 also corresponds on a one-to-one basis with a multiplexer 135 that selects between an input data signal 175 and the low power supply voltage (vddio). A controller 140 controls the selection by each segments's multiplexers 130 and 135. In circumstances in which a given pull-up leg 165 should not contribute to a charging of the output signal terminal 115 to the logic-high output voltage, controller 140 drives the corresponding multiplexer 130 to select for ground to shut off the pull-up leg's thick-oxide pull-up transistor M1. In addition, controller 140 can also force multiplexer 135 to select for the low power supply voltage to maintain the corresponding thin-oxide pull-up transistor P1 off. But it will be appreciated that shutting off thick-oxide transistor M1 will prevent the corresponding pull-up leg 165 from conducting. Thus, multiplexer 135 may be omitted in alternative embodiments. Alternatively, multiplexer 135 may be configured to select for ground instead of the low power supply voltage to maintain thin-oxide transistor P1 on during inactive modes of operation for transmitter 100 to provide electrostatic discharge protection (ESD).

Since there are forty-eight segments in transmitter 100, the control of all the multiplexers 130 or of all the multiplexers 135 requires six bits each. It is advantageous if each set of six control bits is thermometer-encoded. The six control bits for the multiplexers 130 are thus thermometer encoded in a pull-up (PU) decoder 150. The resulting thermometer-encoded output from decoder 150 is thus 48 bits wide, one bit for each multiplexer 130. Depending upon the state of its bit in this 48-bit-wide thermometer encoded output from decoder 150, each multiplexer 130 selects for either the high power supply voltage or ground to enable or disable the corresponding thick-oxide pull-up transistor M1. Similarly, the six control bits for multiplexers 135 are thermometer-encoded by a PU decoder 145 such that each multiplexer 135 is controlled by a corresponding bit in the 48-bit-wide output from PU decoder 145.

Each pull-down leg 170 is implemented analogously to each pull-up leg 165. In particular, each pull-down leg 170 includes a thick-oxide NMOS pull-down transistor M2 having a drain coupled to the output signal terminal 115. A thin-oxide NMOS pull-down transistor M3 has its source coupled to ground and a drain coupled to the source of the corresponding thick-oxide pull-down transistor M2. The control of each pull-down leg 170 is also analogous to the control of each pull-up leg 165 in that a multiplexer 125 in each segment selects between ground and the high power supply voltage to drive the gate of the segment's thick-oxide pull-down transistor M2. Similarly, a multiplexer 120 in each segment selects between the low power supply voltage VDDIO and input data signal 175 to drive the gate of the segment's thin-oxide pull-down transistor M3. Controller 140 controls multiplexers 125 through a set of six control bits that are decoded into a 48-bit-wide thermometer-encoded output by a pull-down (PD) encoder 155. The selection by each multiplexer 125 is controlled by a corresponding bit from this output from encoder 155.

A decoder 160 decodes the same six control bits as received by decoder 145 to produce a 48-bit-wide thermometer-encoded output that controls the selection by multiplexers 120. Although these same six controls bits are shared, the responses by thin-oxide pull-up transistor P1 and thin-oxide pull-down transistor M3 are complementary. In particular, suppose the thermometer encoded bit for a segment's multiplexer 135 causes it to drive the gate of the corresponding thin-oxide transistor P1 with the low power supply voltage so as to shut off this transistor. This same bit causes the same segment's multiplexer 120 to also drive the gate of the corresponding thin-oxide transistor M3 with the low power supply voltage so as to switch on this transistor. The result is that for every thin-oxide pull-up transistor P1 that is shut off, a corresponding thin-oxide transistor M3 is switched on. This tie between the control of these transistors leads to an advantageous constant impedance despite a variation in the logic-high output voltage at output signal terminal 115 as will be explained further herein.

Figure 2:
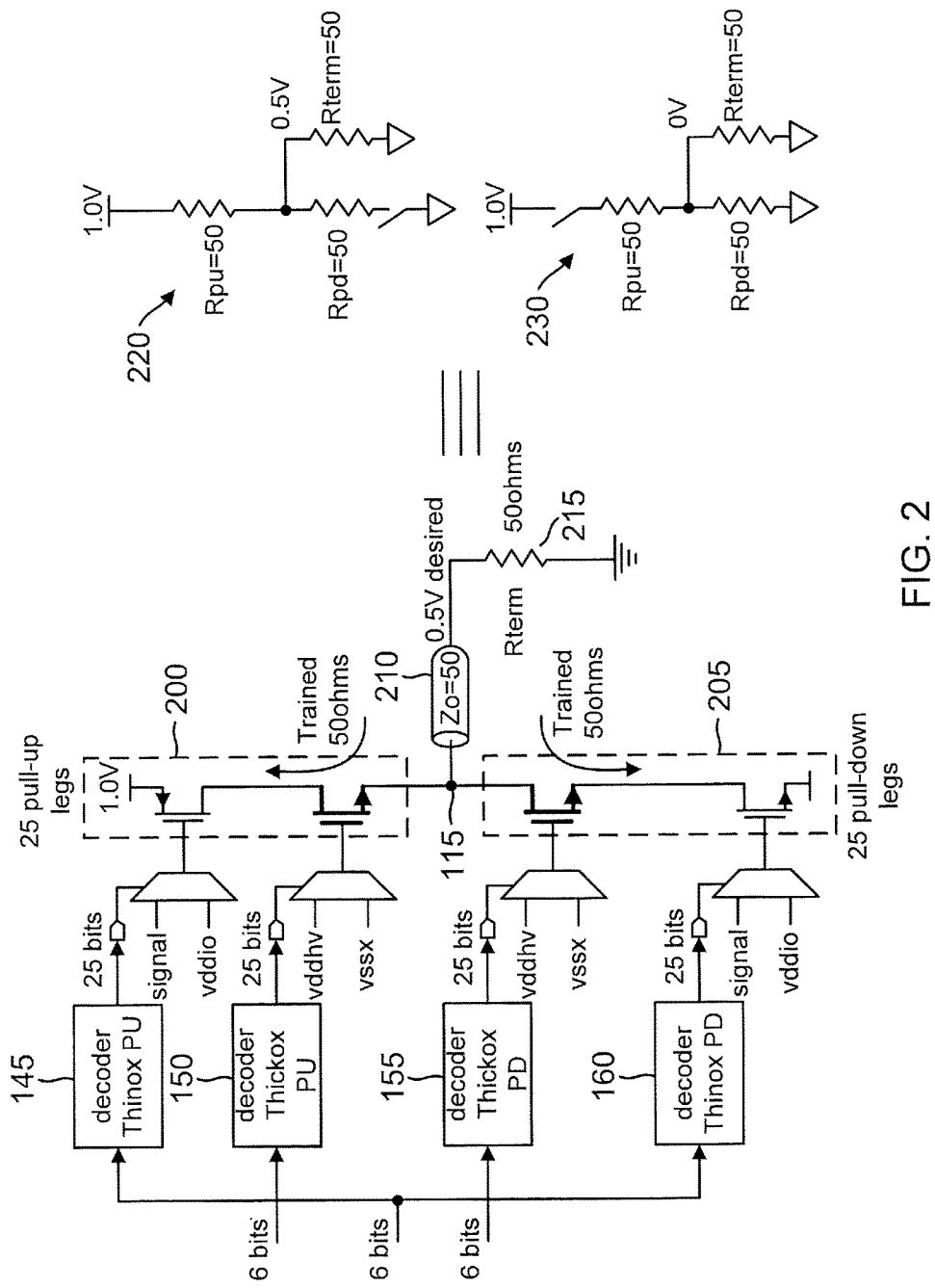
FIG. 2 is simplified circuit diagram for the transmitter of FIG. 1 in which the pull-up legs and pull-down legs are enabled for the maximum logic-high output voltage with a matching output impedance.

The control of the pull-up legs 165 and the pull-down legs 170 depends upon the desired output impedance and the logic-high output voltage. As discussed earlier, should transmitter 100 be transmitting to a DRAM, the DRAM's mode of operation determines the appropriate logic-high output voltage level. But it will be appreciated that transmitter 100 may be used in conjunction with other types of receivers that require variable logic-high output voltages in addition to DRAMs. The highest variable logic-high output voltage for a matched output impedance is one-half of the low power supply voltage. The resulting configuration of transmitter 100 for a one-half rail logic-high output voltage is shown in simplified form in FIG. 2. Output signal terminal 115 couples over a transmission line 210 having an impedance of 50Ω to a receiver represented by a 50Ω resistor (Rterm). Prior to matching this impedance, controller 140 (FIG. 1) may select for a subset of pull-up legs 165 and drive a known impedance. Similarly, controller 140 may select for a subset of pull-down legs 170 to be driven by a current source with a known amount of current. The resulting voltage at output signal terminal 115 in both cases may be used by controller 140 to readily derive the individual impedance of each pull-up leg 165 and pull-down leg 170. Controller 140 may then proceed to select the appropriate number of pull-up legs 165 to be enabled for pull-up and to select for the appropriate number of pull-down legs 170 to be enabled for pull-down to match the transmission line impedance. In FIG. 2, the number of enabled pull-up legs is twenty-five and represented by collective pull-up leg 200. Similarly, the same number of enabled pull-down legs is represented by collective pull-down leg 205. During pull-up, pull-down leg 205 is shutoff whereas pull-up leg 200 is conducting. The resulting equivalent circuit 220 for pull-up is also shown in FIG. 2. In this case, the low power supply voltage is again assumed to equal 1.0 V. The impedance for pull-up leg 220 (50Ω) matches that of the receiver (Rterm) such that the logic-high output voltage is 0.5 V (one-half of the low power supply voltage).

During pull-down, pull-up leg 200 is shut off while pull-down leg 205 conducts to discharge output signal terminal 115 to ground. A resulting equivalent circuit 230 for pull-down is also shown in FIG. 2. Note that the number of enabled pull-down legs represented by pull-down leg 205 is independent of the number of enabled pull-up legs represented by pull-up leg 200. This independence allows transmitter 100 to account for differences (if any) between the pull-up leg impedance and the pull-down leg impedance.

The number of enabled pull-up legs 165 as defined by the switching on of the corresponding thick-oxide pull-up transistors M1 and the number of enabled pull-down legs 170 as defined by the switching on of the corresponding pull-down transistors M2 defines the pull-up output impedance and the pull-down output impedance for transmitter 100 while satisfying a logic-high output voltage of one-half the low power supply voltage. But there may be modes of operation for a receiver in which such a logic-high output voltage level is too high such as when transmitting to DRAMs that are operating in a reduced logic-high voltage mode of operation. To reduce the logic-high output voltage, a number of previously-enabled pull-up legs 165 are switched off. But to keep the output impedance for transmitter 100 unchanged from its matched level, a corresponding number of enabled pull-down legs 170 are continuously switched on. In that regard, a pull-up leg 165 or a pull-down leg 170 is said to be "enabled" when its thick-oxide transistor (M1 or M2, respectively) is switched on. An enabled pull-down leg 170 is deemed herein to be "continuously switched on" when its multiplexer 120 selects for the low power supply voltage rather than input data signal 175. In that case, the corresponding pull-down leg 170 will be conducting regardless of the binary state for the input data signal 175 such that it conducts both during pull-down and pull-up of output signal terminal 115. With regard to pull-up, the impedance of each switched-off pull-up leg 165 is replaced by the corresponding continuously switched on pull-down leg 170. If the impedances are different, the number of continually-switched on pull-down legs 170 is adjusted with regard to the number of switched-off pull-up legs 165 (from the set of formerly enabled pull-up legs 165) by the impedance difference. If the impedances are substantially the same, each switched-off pull-up leg 165 is replaced by a continually-switched on pull-down leg 170.

Figure 3:
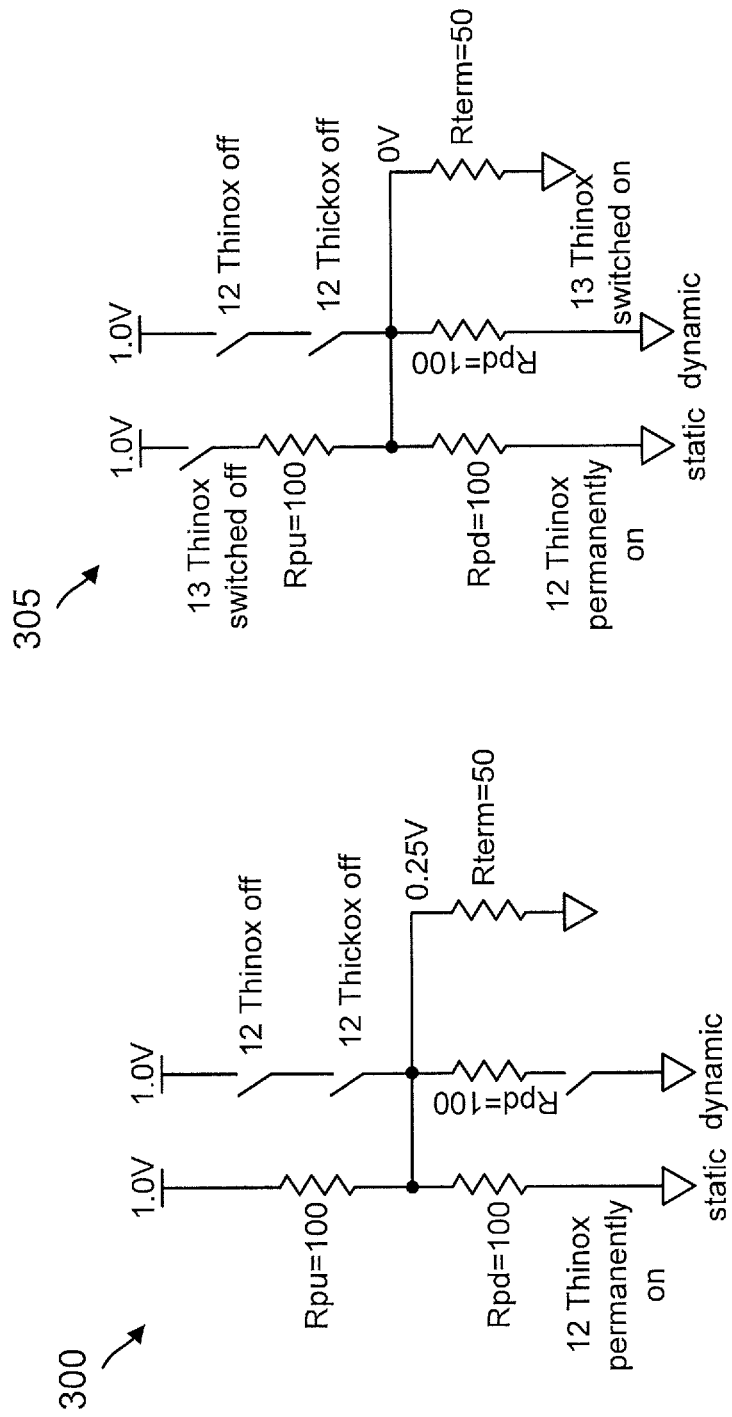
FIG. 3 illustrates the equivalent circuits for the transmitter of FIG. 2 during pull-up and pull-down for a reduced logic-high output voltage with a matching output impedance.

An example equivalent circuit 300 for transmitter 100 (FIG. 1) during pull-up is shown in FIG. 3 for providing a reduced logic-high output voltage of one-fourth the low power supply voltage. In this example, the number of enabled pull-up legs 165 and enabled pull-down legs 175 to provide a matched output impedance for a logic-high output voltage of one-half the low power supply voltage is as discussed with regard to FIG. 2, which required twenty-five enabled pull-up legs 165 and twenty-five enabled pull-down legs 170. In circuit 300, twelve of the formerly-enabled pull-up legs have been disabled such that their thin-oxide and thick-oxide transistors are both shut off. Assuming that the pull-up and pull-down leg impedances are the same, the disabling of twelve pull-up legs is performed in conjunction with the conversion of twelve enabled pull-down legs into continuously switched on pull-down legs as shown by the static pull-down leg in equivalent circuit 300. The resulting output impedance for equivalent circuit 300 is still matched to 50Ω because the 100Ω resistance of the remaining enabled pull-up legs is in parallel with the 100Ω resistance of the continuously switched on pull-down legs. But the logic-high output voltage for equivalent circuit 300 is just one-fourth of the low power supply voltage as can be readily shown for the voltage division performed by equivalent circuit 300 in producing the logic-high output voltage from the low power supply voltage. In particular, the 100Ω resistance of the continuously switched on pull-down legs is in parallel with the 50Ω resistance of the receiver (Rterm), which produces an equivalent resistance of 33.33Ω. The resulting voltage divider for equivalent circuit 300 becomes 33.33/133.33=0.25 as desired. In equivalent circuit 300, the low power supply voltage equals 1.0 V such the logic-high output voltage equals 0.25 V.

During pull-down, all the pull-up legs are non-conducting as shown for equivalent circuit 305. The 100Ω resistance of the continuously switched on pull-down legs is in parallel with the 100Ω resistance of the dynamically switched on pull-down legs (as determined by the binary state of the input data signal) to provide a matched output impedance of 50Ω such that the pull-down behavior is as discussed with regard to FIG. 2.

To decrease the logic-high output voltage, additional pull-down legs from the set of enabled pull-down legs may be converted into continuously switched on pull-down legs. A corresponding number of pull-up legs from the set of enabled pull-up legs are then converted into switched-off pull-up legs. Reversing this process causes the logic-high output voltage to rise until none of the formerly-enabled pull-down legs are switched off. At that point, the logic-high output voltage will equal one-half the low power supply voltage as discussed with regard to FIG. 2. To raise the logic-high output voltage from this maximum level for a matched output impedance results in the pull-up output impedance not being matched to the transmission line and receiver impedance. Controller 140 (FIG. 1) would then increase the number of enabled pull-up legs 165 as necessary above the matching-impedance number to provide the desired logic-high output impedance. The resulting impedance control is quite advantageous as in that the control of thick-oxide transistors M1 and M2 is outside of the relatively high-speed input data signal path. Moreover, the control of the data paths requires only one level of multiplexers 135 and 120 such that jitter and other signal integrity issues are reduced.

The combination of controller 140, decoders 145, 150, 155, and 160, and also multiplexers 120, 125, 130, and 135 may be deemed to form a means for controlling both the pull-up legs 165 and the pull-down legs 170 to maintain a constant output impedance for the transmitter 100 while supporting a variation in a logic-high output voltage for the transmitter 100.

Figure 4:
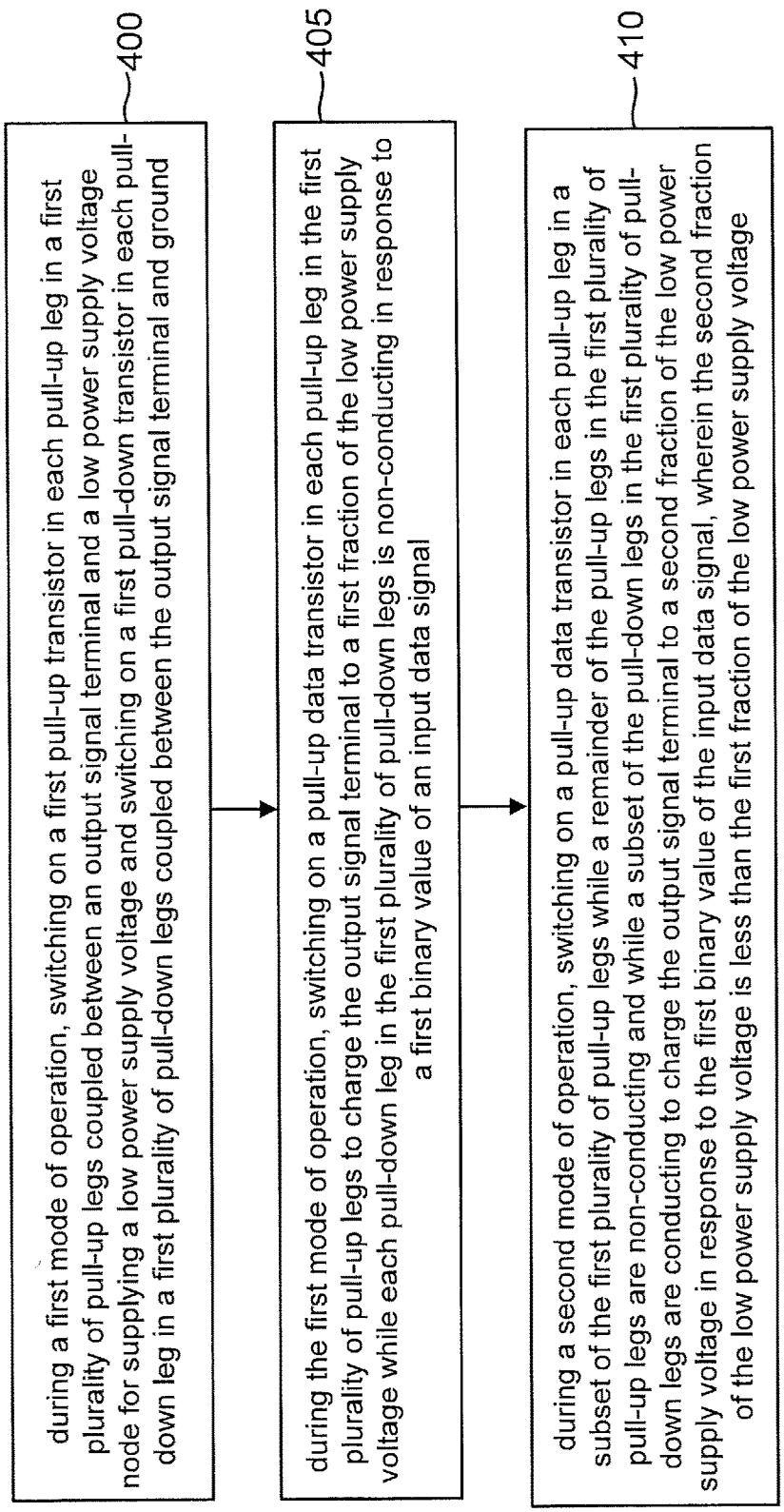
FIG. 4 is a flowchart for an example method of operation for a transmitter in accordance with an aspect of the disclosure.

An example method of operation for a transmitter will now be discussed with regard to the flowchart of FIG. 4. The method includes an act 400 of, during a first mode of operation, switching on a first pull-up transistor in each pull-up leg in a first plurality of pull-up legs coupled between an output signal terminal and a low power supply voltage node for supplying a low power supply voltage and switching on a first pull-down transistor in each pull-down leg in a first plurality of pull-down legs coupled between the output signal terminal and ground. An example of act 400 is the switching on of twenty-five of the thick-oxide transistors M1 and M2 as discussed with regard to FIG. 2.

The method also includes an act 405 of, during the first mode of operation, switching on a pull-up data transistor in each pull-up leg in the first plurality of pull-up legs to charge the output signal terminal to a first fraction of the low power supply voltage while each pull-down leg in the first plurality of pull-down legs is non-conducting in response to a first binary value of an input data signal. The dynamic switching on of the twenty-five thin-oxide transistors P1 in response to a binary-zero value of the input data signal as shown for the equivalent pull-up circuit 220 in FIG. 2 is an example of act 405.

Finally, the method includes an act 410 of, during a second mode of operation, switching on a pull-up data transistor in each pull-up leg in a subset of the first plurality of pull-up legs while a remainder of the pull-up legs in the first plurality of pull-up legs are non-conducting and while a subset of the pull-down legs in the first plurality of pull-down legs are conducting to charge the output signal terminal to a second fraction of the low power supply voltage in response to the first binary value of the input data signal, wherein the second fraction of the low power supply voltage is less than the first fraction of the low power supply voltage. The switching on of the thin-oxide transistor P1 in the remaining enabled pull-up legs while the static pull-down legs are conducting as discussed with regard to equivalent circuit 300 is an example of act 410.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:
1. A transmitter, comprising:
an output signal terminal;

a plurality of pull-up paths coupled in parallel between the output signal terminal and a power supply node for supplying a low power supply voltage, wherein each pull-up path includes a first pull-up transistor in series with a second pull-up transistor;

a plurality of pull-down paths coupled in parallel between the output signal terminal and ground, wherein each pull-down path includes a first pull-down transistor in series with a second pull-down transistor; and a controller configured to switch on the second pull-up transistors in a subset of the pull-up paths from the plurality of pull-up paths and to configure the first pull-up transistors in the subset of the pull-up paths to switch on in response to a first binary value of an input data signal, and wherein the controller is further configured to switch on the second pull-down transistors in a subset of the pull-down paths from the plurality of pull-down paths and to configure the first pull-down transistors in the subset of the pull-down paths to switch on in response to a second binary value of the input data signal, wherein each pull-up path's first pull-up transistor is a PMOS transistor having a source coupled to the power supply node, and wherein each pull-up path's second pull-up transistor is an NMOS transistor having a drain coupled to a drain for the pull-up path's PMOS transistor and a source coupled to the output signal terminal.

2. The transmitter of claim 1, wherein each PMOS transistor is a thin-oxide transistor and wherein each NMOS transistor is a thick-oxide transistor, wherein a gate oxide layer for each thick-oxide transistor is thicker than a gate oxide layer for each thin-oxide transistor.

3. The transmitter of claim 2, further comprising:
a first decoder for the NMOS transistors; and
a second decoder for the PMOS transistors, wherein the controller is configured to switch on the NMOS transistors using a first set of control bits provided to the first decoder and to configure the PMOS transistors to switch on using a second set of control bits provided to the second decoder.

4. The transmitter of claim 3, where the first decoder and the second decoder are both thermometer code decoders.

5. The transmitter of claim 2, further comprising a plurality of first multiplexers and a plurality of second multiplexers both corresponding to the plurality of pull-up legs on a one-to-one basis, wherein each first multiplexer is configured to select between a high power supply voltage and ground to drive a gate of the NMOS transistor in the corresponding pull-up leg, and wherein each second multiplexer is configured to select between the input data signal and the low power supply voltage to drive a gate of the PMOS transistor in the corresponding pull-up leg, and wherein the high power supply voltage is greater than the low power supply voltage.

6. The transmitter of claim 5, wherein the controller is configured to control the first multiplexers corresponding to the pull-up legs in the subset of pull-up legs to select for the high power supply voltage and to control the first multiplexers for a remainder of the pull-up legs in the plurality of pull-up legs besides those in the subset of pull-up legs to select for ground.

7. The transmitter of claim 5, wherein the controller is configured to control the second multiplexers corresponding to the pull-up legs in the subset of pull-up legs to select for the input data signal and to control the second multiplexers for a remainder of the pull-up legs in the plurality of pull-up legs besides those in the subset of pull-up legs to select for the low power supply voltage.

8. The transmitter of claim 1, wherein the second pull-down transistor in each pull-down leg is a thick-oxide NMOS transistor having a drain coupled to the output signal terminal, and wherein the first pull-down transistor in each pull-down leg is a thin-oxide NMOS transistor having a drain coupled to the source of the pull-down leg's thick oxide NMOS transistor and having a source coupled to ground, and wherein a gate oxide thickness for each thick-oxide NMOS transistor is thicker than a gate oxide thickness for each thin-oxide NMOS transistor.

9. The transmitter of claim 8, further comprising a plurality of first multiplexers and a plurality of second multiplexers both corresponding to the plurality of pull-down legs on a one-to-one basis, wherein each first multiplexer is configured to select between a high power supply voltage and ground to drive a gate of the thick-oxide NMOS transistor in the corresponding pull-down leg, and wherein each second multiplexer is configured to select between the input data signal and the low power supply voltage to drive a gate of the thin-oxide NMOS transistor in the corresponding pull-down leg, and wherein the high power supply voltage is greater than the low power supply voltage.

10. The transmitter of claim 9, wherein the controller is configured to control the first multiplexers corresponding to the pull-down legs in the subset of pull-down legs to select for the high power supply voltage and to control the first multiplexers for a remainder of the pull-down legs in the plurality of pull-down legs besides those in the subset of pull-down legs to select for ground.

11. The transmitter of claim 9, wherein the controller is configured to control the second multiplexers corresponding to the pull-down legs in the subset of pull-down legs to select for the input data signal.

12. The transmitter of claim 1, wherein the controller is configured to switch on the second pull-up transistors in the subset of pull-up legs to match a pull-up output impedance for the transmitter to a transmission line impedance while the first pull-up transistors in the subset of pull-up legs are switched on, and wherein the controller is further configured to switch on the second pull-down transistors in the subset of pull-down legs to match a pull-down output impedance for the transmitter to the transmission line impedance while the first pull-down transistors in the subset of pull-down legs are switched on.

13. The transmitter of claim 12, wherein the controller is further configured to switch off the second pull-up transistor in a first number of the pull-up legs in the subset of pull-up legs and to continuously switch on the first pull-down transistor in a second number of pull-down legs in the subset of pull-down legs to lower a logic-high output voltage for the transmitter while maintaining the matching of the pull-up output impedance and the pull-down output impedance to the transmission line impedance.

14. The transmitter of claim 13, wherein the controller is configured so that the first number of pull-up legs equals the second number of pull-down legs.

15. A method, comprising:
during a first mode of operation, switching on a first pull-up transistor in each pull-up leg in a first plurality of pull-up legs coupled between an output signal terminal and a low power supply voltage node for supplying a low power supply voltage and switching on a first pull-down transistor in each pull-down leg in a first plurality of pull-down legs coupled between the output signal terminal and ground;

during the first mode of operation, switching on a pull-up data transistor in each pull-up leg in the first plurality of pull-up legs to charge the output signal terminal to a first fraction of the low power supply voltage while each pull-down leg in the first plurality of pull-down legs is non-conducting in response to a first binary value of an input data signal;

during a second mode of operation, switching on the pull-up data transistor in each pull-up leg in a subset of the first plurality of pull-up legs while a first number of the pull-up legs in the first plurality of pull-up legs besides the pull-up legs in the subset of pull-up legs are non-conducting and while a second number of the pull-down legs in the first plurality of pull-down legs are conducting to charge the output signal terminal to a second fraction of the low power supply voltage in response to the first binary value of the input data signal, wherein the second fraction of the low power supply voltage is less than the first fraction of the low power supply voltage.

16. The method of claim 15, wherein the first number of pull-up legs equals the second number of pull-down legs.

17. The method of claim 15, wherein the switching on of the first pull-up transistors comprises driving a gate for each first pull-up transistor with a high power supply voltage that is greater than the lower power supply voltage, and wherein the switching on of the first pull-down transistors comprises driving a gate for each first pull-down transistor with the high power supply voltage.

18. A transmitter, a plurality of pull-up legs, each pull-up leg including a thick-oxide pull-up transistor in series with a thin-oxide pull-up transistor;

a plurality of pull-down legs, each pull-down leg including a thick-oxide pull-down transistor in series with a thin-oxide pull-down transistor; and means for controlling the pull-up legs and pull-down legs to maintain a constant output impedance for the transmitter while supporting a variation in a logic-high output voltage for the transmitter, wherein each thin-oxide pull-up transistor is a thin-oxide PMOS transistor, each thick-oxide pull-up transistor is a first thick-oxide NMOS transistor, each thick-oxide pull-down transistor is a second thick-oxide NMOS transistor, and each thin-oxide pull-down transistor is a thin-oxide NMOS transistor.

* * * * *